(12) United States Patent
Kim (10) Patent No.: US 7,395,398 B2
(45) Date of Patent: Jul. 1, 2008

(54) MEMORY CONTROLLER THAT SELECTIVELY CHANGES FREQUENCY OF A MEMORY CLOCK SIGNAL, A SMART CARD INCLUDING THE SAME, AND A METHOD OF CONTROLLING A READ OPERATION OF A MEMORY

(75) Inventor: Min-kyu Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 268 days.

(21) Appl. No.: 10/915,221

(22) Filed: Aug. 10, 2004

(65) Prior Publication Data
US 2005/0038970 A1 Feb. 17, 2005

(30) Foreign Application Priority Data
Aug. 12, 2003 (KR) .................. 10-2003-0055876

(51) Int. Cl.
*G06F 12/00* (2006.01)
*G06F 1/08* (2006.01)
(52) U.S. Cl. ............... 711/167; 711/103; 711/105; 713/501
(58) Field of Classification Search ............... 711/103, 711/105, 167; 713/501; 235/380, 487, 492
See application file for complete search history.

(56) References Cited

U.S. PATENT DOCUMENTS

| | | | | |
|---|---|---|---|---|
| 4,794,523 A | * | 12/1988 | Adan et al. ............. | 713/100 |
| 5,819,076 A | * | 10/1998 | Jeddeloh et al. ......... | 713/401 |
| 6,073,223 A | * | 6/2000 | McAllister et al. ....... | 711/167 |
| 6,510,095 B1 | | 1/2003 | Matsuzaki et al. | |
| 2002/0039324 A1 | | 4/2002 | Lee | |

FOREIGN PATENT DOCUMENTS

EP 0 827 154 A2 4/1998

OTHER PUBLICATIONS

Hendry, Mike Smart Card Security and Applications, (c) 1997, Artech House, pp. 82-83, 226 ISBN: 0-89006-953-0.*

* cited by examiner

*Primary Examiner*—Hyung S. Sough
*Assistant Examiner*—Shawn Eland
(74) *Attorney, Agent, or Firm*—F. Chau & Assoc., LLC (57) ABSTRACT

Provided are a memory controller that selectively changes a frequency of a memory clock signal, a smart card including the memory controller, and a method of controlling a read operation of a memory. The memory controller includes a central processing unit (CPU), a memory interface, and a frequency change controller. The CPU outputs a read command signal in response to a data read request signal and outputs a write command signal in response to a data write request signal. The memory interface outputs a plurality of control signals in response to one of the read command signal and the write command signal, generates a memory clock signal based on a system clock signal, and changes a frequency of the memory clock signal in response to a frequency change control signal. The frequency change controller outputs the frequency change control signal in response to the plurality of control signals and the memory clock signal. The memory controller, the smart card including the memory controller, and the method of controlling a read operation of a memory prevent the memory from outputting erroneous data when the memory is operated at a high frequency.

16 Claims, 10 Drawing Sheets

MEMORY CONTROLLER THAT SELECTIVELY CHANGES FREQUENCY OF A MEMORY CLOCK SIGNAL, A SMART CARD INCLUDING THE SAME, AND A METHOD OF CONTROLLING A READ OPERATION OF A MEMORY

CROSS-REFERENCE TO RELATED APPLICATION

This application claims priority to Korean Patent Application No. 2003-55876, filed on Aug. 12, 2003, in the Korean Intellectual Property Office, the disclosure of which is incorporated herein in its entirety by reference.

BACKGROUND OF THE INVENTION

1. Technical Field

The present invention relates to a memory device, and more particularly, to a method of controlling a read operation of a memory device.

2. Discussion of the Related Art

With the development of semiconductor manufacturing technology, a system-on-chip (SOC), in which a plurality of system chips are integrated into a single chip, has been proposed. The SOC typically includes a memory that stores an operating system (OS) program or data that is generated when the OS program is executed.

In general, a memory includes a memory cell array having a matrix structure. The memory receives a row address signal, a column address signal, and a data read control signal or a data write control signal from a memory controller. The memory outputs data of a corresponding memory cell or writes data to a corresponding memory cell in response to the data read control signal or the data write control signal. Furthermore, the memory reads or writes data in synchronization with a memory clock signal received from the memory controller. The memory controller receives a system clock signal and generates the memory clock signal. The system clock signal is used in the memory controller and a system including the memory controller while the memory clock signal is used only in the memory. The system corresponds to an SOC including the memory controller and the memory.

An example of a memory controller that generates a memory clock signal from a system clock signal and provides the memory clock signal to a plurality of memories is disclosed in U.S. Pat. No. 5,630,096, entitled "Controller for a synchronous DRAM that maximizes throughput by allowing memory requests and commands to be issued out of order".

Figure 1:
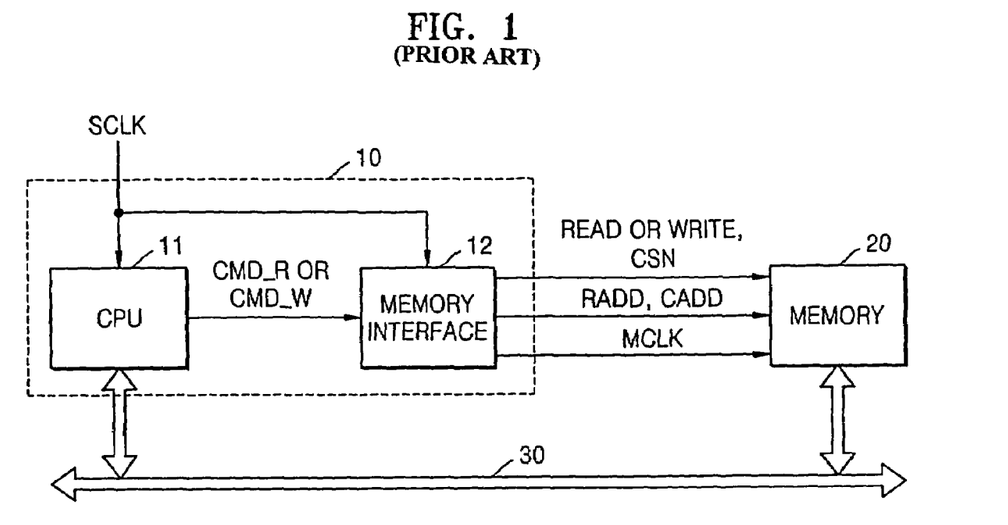
FIG. 1 is a block diagram of a conventional memory controller and a memory.

FIG. 1 is a block diagram of a conventional memory controller 10 and a memory 20. Referring to FIG. 1, the memory controller 10 includes a central processing unit (CPU) 11 and a memory interface 12 connected to the memory 20. The CPU 11 and the memory 20 are also connected to a data bus 30.

Figure 2:
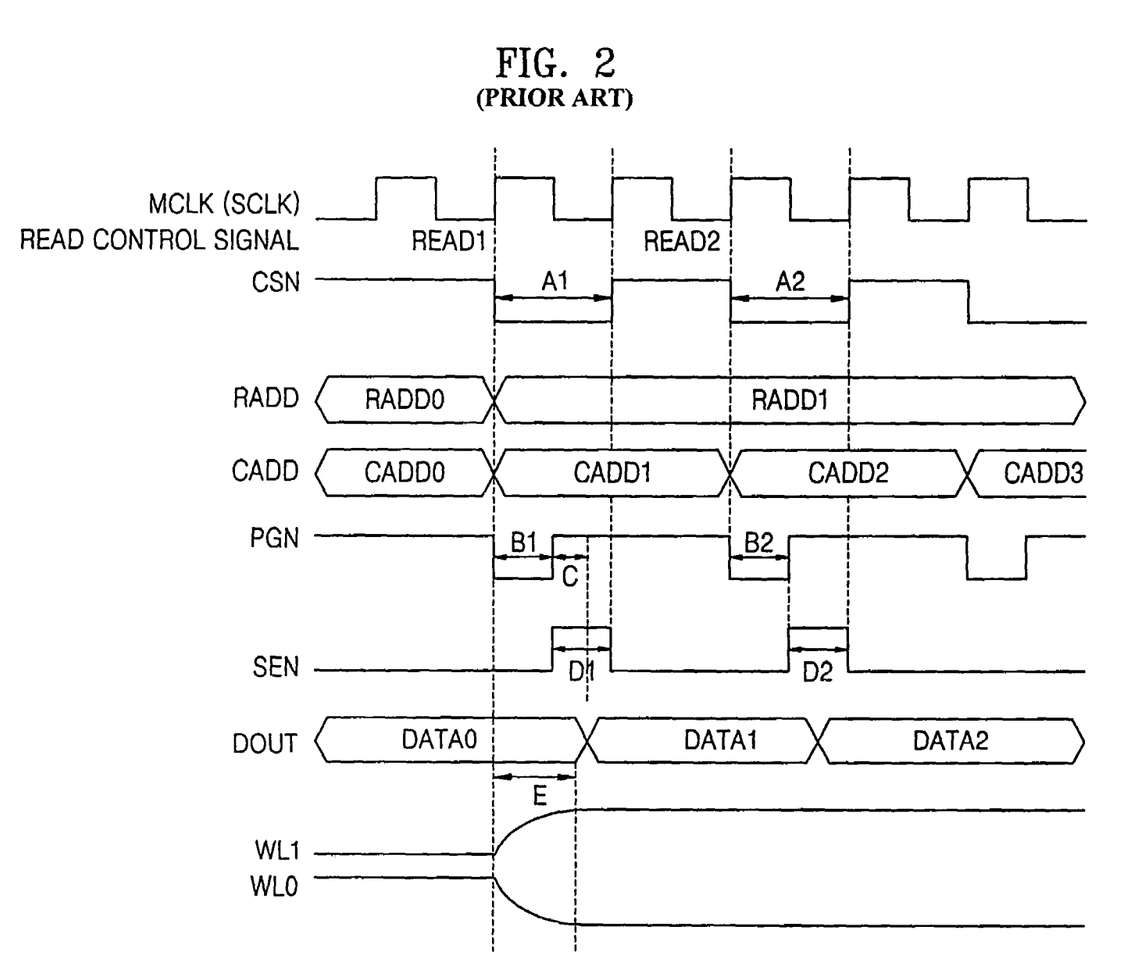
FIG. 2 is a timing diagram of signals used in a read operation of a memory, produced by a conventional memory controller.

A method of controlling a read operation of the memory 20 with the conventional memory controller 10 will now be explained with reference to FIGS. 1 and 2. FIG. 2 is a timing diagram of signals used in the read operation of the memory 20.

In FIG. 2, a row address signal RADD, a column address signal CADD, and a pre-charge control signal PGN are required for the reading of a memory cell of the memory 20. A memory clock signal MCLK is identical to a system clock signal SCLK.

Referring to FIG. 2, a time interval "D1", during which a sense amplifier control signal SEN is enabled, must be longer than a time interval "C" required for an effective data signal to be output from a memory cell. Furthermore, to output the effective data signal from the memory cell, a cell transistor must allow a sufficient cell current to flow. For this purpose, a wordline WL1 connected to a gate of the cell transistor must be sufficiently activated to reach a set voltage level.

As a time interval "E" required for the wordline WL1 to be sufficiently activated to reach the set voltage level increases, the interval "C" increases. Consequently, a time interval required for a bit line sense amplifier to amplify a data signal to evaluate a data value also increases. As a result, the interval "E" has the largest effect on the read operation of the memory 20.

As further shown in FIG. 2, the time interval "E" appears in a time interval "A1", during which the row address signal is shifted, but does not appear in a time interval "A2", during which the row address signal is not shifted. Thus, a read speed of the memory 20 is reduced more during the interval "A1" than the interval "A2". Accordingly, when the memory 20 must operate at a high frequency erroneous data may be output. For example, when the frequency of the memory clock signal MCLK is increased during the interval "A1", an enable interval of a chip select signal CSN becomes shorter. Thus, a time interval "B1" and the time interval "D1" also become shorter. However, the interval "E" is not varied but is uniformly maintained so that the interval "C" becomes longer than the interval "D1". Consequently, the memory 20 outputs erroneous data.

Figure 3:
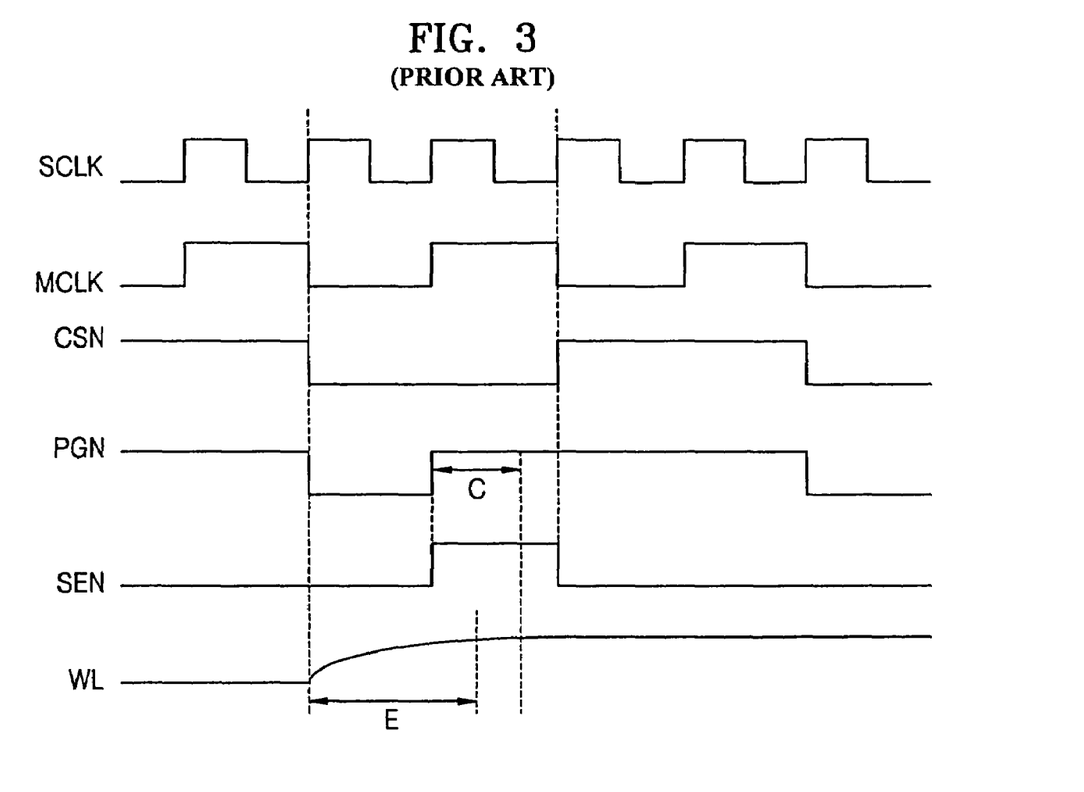
FIG. 3 is a timing diagram of signals used in a read operation of a memory, produced by another conventional memory controller.

To prevent the memory 20 from outputting erroneous data when operating at a high frequency, a conventional memory interface divides the system clock signal SCLK to generate a memory clock signal MCLK having a frequency lower than the frequency of the system clock signal SCLK, as shown in FIG. 3. Accordingly, the enable interval of the chip select signal CSN is longer and the interval "E" required for the wordline WL to be sufficiently activated and the interval "C" required for an effective data signal to be output from the memory cell can be secured. In a system in which the read operation of the memory 20 is frequently executed, however, the performance of the system deteriorates as the frequency of the memory clock signal MCLK decreases.

SUMMARY OF THE INVENTION

The present invention provides a memory controller that prevents a memory from outputting erroneous data when operating at a high frequency and improves the performance of a system in which a read operation of the memory is frequently executed. In addition, the present invention provides a smart card including a memory controller that prevents a memory from outputting erroneous data when operating at a high frequency and improves the performance of a system in which a read operation of the memory is frequently executed. Further, the present invention provides a method of controlling a read operation of a memory using a memory controller that prevents the memory from outputting erroneous data when operating at a high frequency and improves the operation performance of a system in which a read operation of the memory is frequently executed.

According to an aspect of the present invention, there is provided a memory controller that controls one of a read operation and a write operation of a memory. The memory controller includes a central processing unit (CPU), a memory interface, and a frequency change controller. The CPU outputs a read command signal in response to a data read request signal and outputs a write command signal in response to a data write request signal. The memory interface outputs a plurality of control signals in response to one of the read command signal and the write command signal, generates a memory clock signal in response to a system clock signal, and changes a frequency of the memory clock signal in response to a frequency change control signal. The frequency change controller outputs the frequency change control signal in response to the plurality of control signals and the memory clock signal.

According to another aspect of the present invention, there is provided a smart card comprising a read only memory (ROM), a clock signal generator, an abnormal state detector, a nonvolatile memory, and a memory controller. The ROM stores an operating system (OS) program, and the clock signal generator generates a system clock signal. The abnormal state detector detects an abnormal state caused by a variation in external environments and generates a reset signal based on the detected result. The nonvolatile memory stores data, and the memory controller generates a memory clock signal in response to the system clock signal, controls a read operation or a write operation of the nonvolatile memory while changing a frequency of the memory clock signal, and executes the OS program to store user information.

According to yet another aspect of the present invention, there is provided a method of controlling a read operation of a memory comprising: receiving a data read request signal; outputting control signals in response to the data read request signal; and determining a frequency of a memory clock signal in response to a frequency change control signal, and generating the memory clock signal having the determined frequency.

BRIEF DESCRIPTION OF THE DRAWINGS

The above features of the present invention will become more apparent by describing in detail exemplary embodiments thereof with reference to the attached drawings, in which.

DETAILED DESCRIPTION OF EXEMPLARY EMBODIMENTS

Figure 4:
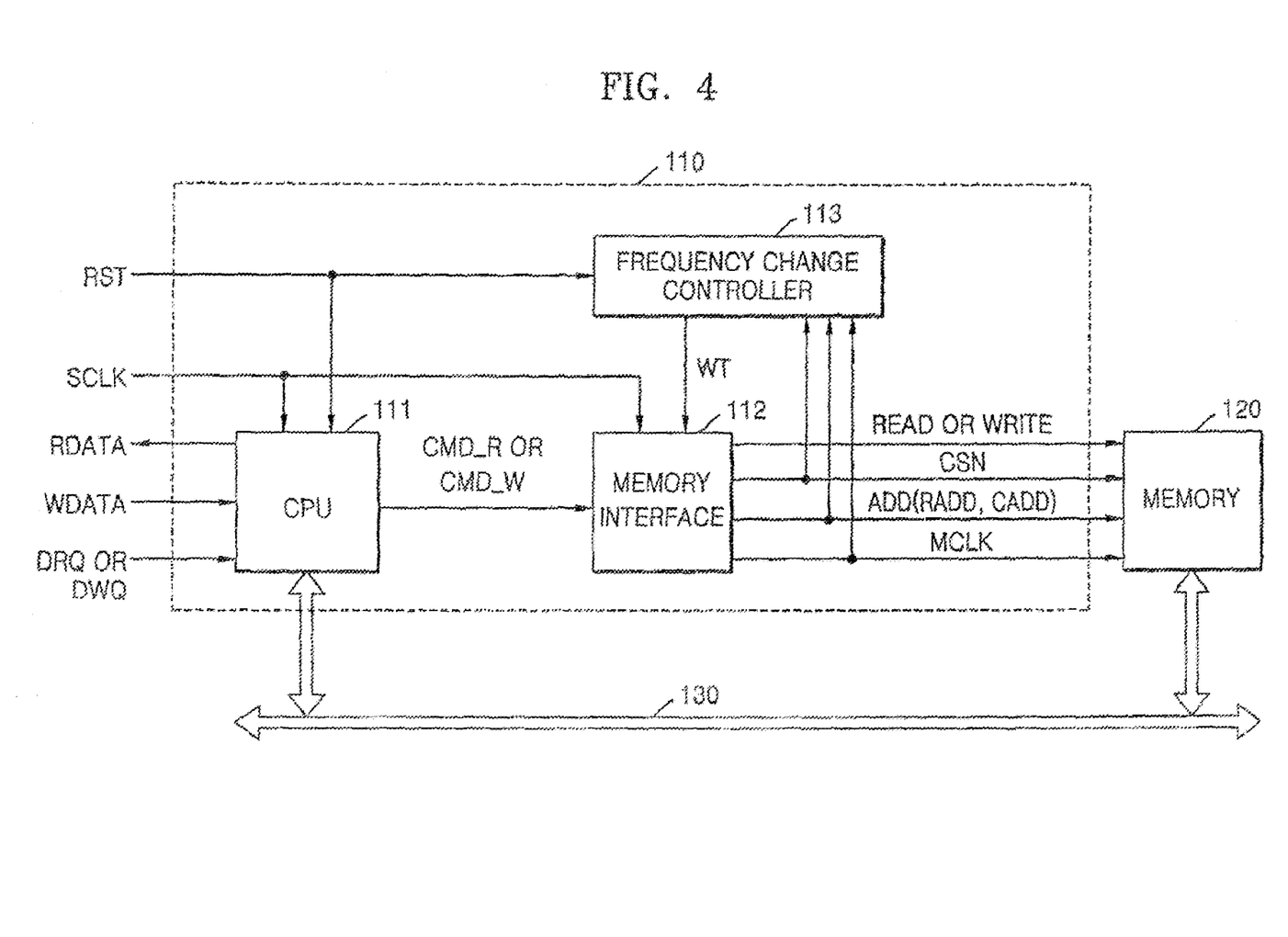
FIG. 4 is a block diagram of a memory controller and a memory according to an exemplary embodiment of the present invention.

FIG. 4 is a block diagram of a memory controller 110 and a memory 120 according to an exemplary embodiment of the present invention. Referring to FIG. 4, the memory controller 110 includes a central processing unit (CPU) 111, a memory interface 112, and a frequency change controller 113. The memory interface 112 is connected to the memory 120. The CPU 111 outputs a read command signal CMD_R or a write command signal CMD_W to the memory interface 112 when the CPU 111 receives an external data read request signal DRQ or an external data write request signal DWQ.

The memory interface 112 outputs a data read control signal READ or a data write control signal WRITE to the memory 120 in response to the read command signal CMD_R or write command signal CMD_W, respectively. In addition, the memory interface 112 outputs a chip select signal CSN, a row address signal RADD and a column address signal CADD to the memory 120. While FIG. 4 illustrates the memory interface 112 outputting the row address signal RADD and the column address signal CADD through the same address line, the memory interface 112 can also output the row address signal RADD and the column address signal CADD through different address lines.

The memory interface 112 also receives a system clock signal SCLK and generates a memory clock signal MCLK. The memory interface 112 will be explained later in more detail with reference to FIG. 6. The system clock signal SCLK can be input to the memory controller 110 from an external device or generated by an internal clock signal generator. The system clock signal SCLK is used by the memory controller 110 and a system including the memory controller 110 and the memory 120. The system can be a system-on-chip (SOC). The memory clock signal MCLK is used by the memory 120.

The frequency change controller 113 receives the chip select signal CSN, the row address signal RADD, the column address signal CADD and the memory clock signal MCLK. The frequency change controller 113 generates a frequency change control signal WT in response to the row address signal RADD. The frequency change controller 113 generates the frequency change control signal WT when a read operation of the memory 120 is first carried out after the frequency change controller 113 receives an external reset signal RST. The frequency change controller 113 will be explained later in more detail with reference to FIG. 5.

The memory 120 outputs data RDATA to an internal data bus 130 or writes data WDATA received from the internal data bus 130 in response to the row address signal RADD, the column address signal CADD, and the data read control signal READ or the data write control signal WRITE. FIG. 4 does not show a detailed configuration of the memory 120 because the memory 120 can be understood by one of ordinary skill in the art.

The CPU 111 outputs the data RDATA, which is received from the memory 120 via the internal data bus 130, to an external device that requests the memory controller 110 to read the data RDATA. In addition, the CPU 111 transmits the data WDATA, which is received from an external device that requests the memory controller 110 to write the data, to the memory 120 via the internal data bus 130.

Figure 5:
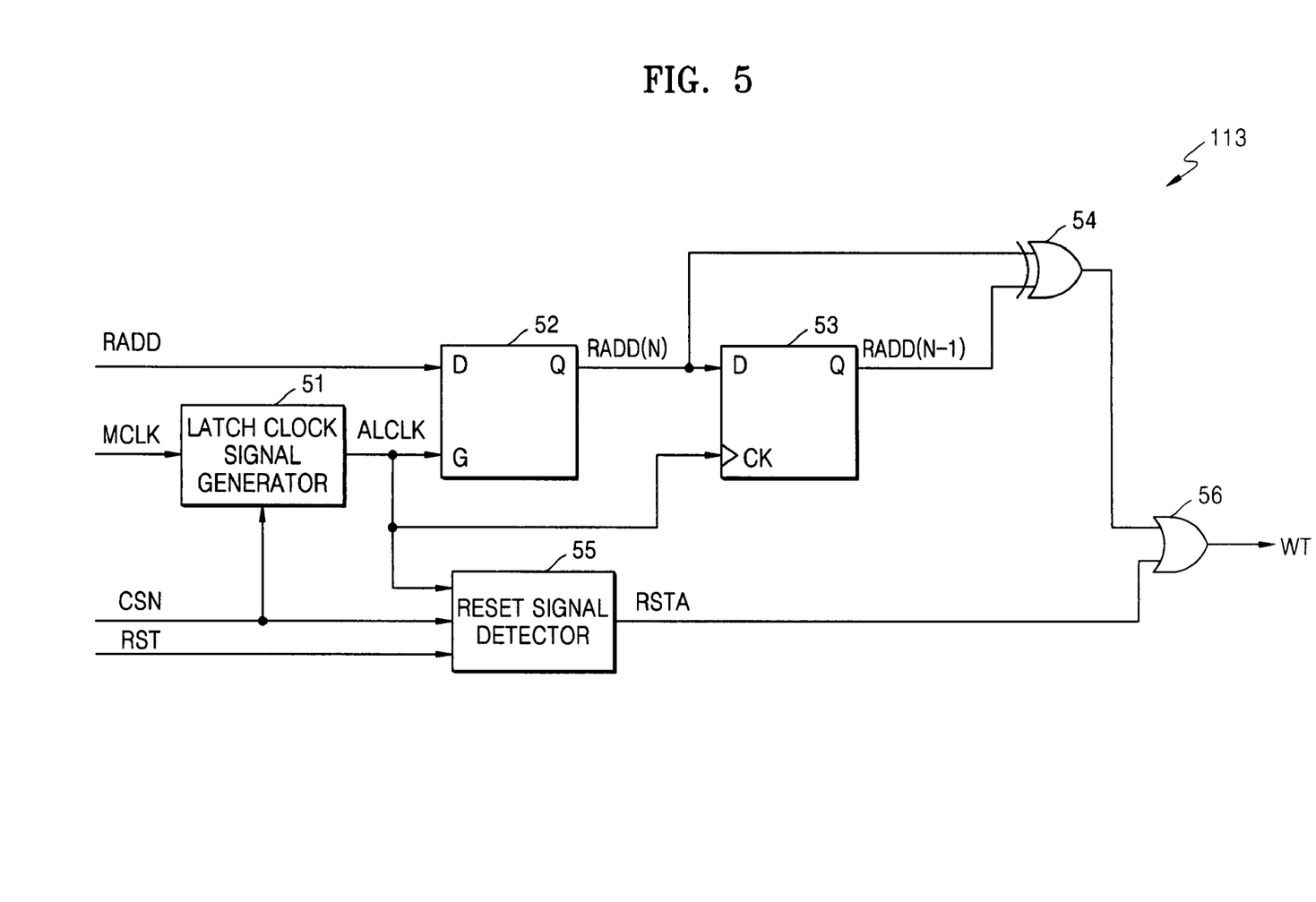
FIG. 5 is a block diagram of the frequency change controller shown in FIG. 4.

FIG. 5 is a block diagram of the frequency change controller 113 shown in FIG. 4. Referring to FIG. 5, the frequency change controller 113 includes a latch clock signal generator 51, an address latch 52, an address storage unit 53, an address comparator 54, a reset signal detector 55, and a frequency change control signal output unit 56.

The latch clock signal generator 51 generates a latch clock signal ALCLK in response to the memory clock signal MCLK and the chip select signal CSN received from the memory interface 112 shown in FIG. 4. The address latch 52 latches row address signals RADD(N) (N is a natural number greater than 1), which are consecutively received from the memory interface 112, in response to the latch clock signal ALCLK. The address latch 52 receives the row address signals RADD(N) when the latch clock signal ALCLK input to a gate input port G thereof is at a high level but it does not receive the row address signals RADD(N) when the latch clock signal ALCLK is at a low level.

In other words, the address latch 52 consecutively outputs the latched row address signals RADD(N) when the latch clock signal ALCLK is at a high level. The address latch 52 maintains the output of the most recently latched row address signal RADD(N) when the latch clock signal ALCLK is at a low level.

The address storage unit 53 stores the row address signal RADD(N) received from the address latch 52 in response to the latch clock signal ALCLK. The address storage unit 53 can be a D flip-flop. The D flip-flop 53 receives the row address signal RADD(N) via an input port D and receives the latch clock signal ALCLK via a clock input port. The D flip-flop 53 receives and stores the row address signal RADD (N) when the row address signal RADD(N) shifts at a rising edge of the latch clock signal ALCLK. The operations of the address latch 52 and address storage unit 53 will now be explained in more detail.

For purposes of this explanation, assume that row address signals RADD0 and RADD1 are consecutively input to the address latch 52 when the latch clock signal ALCLK is at a high level. In this case, the address latch 52 latches the consecutively received row address signals RADD0 and RADD1 because the latch clock signal ALCLK is at a high level. The address storage unit 53 receives the row address signal RADD0 in synchronization with a rising edge of the latch clock signal ALCLK. The address storage unit 53 maintains the output of the row address signal RADD0 until the next rising edge of the latch clock signal ALCLK. Accordingly, when the address latch 52 latches the row address signal RADD1 and outputs the latched row address signal RADD1, the address storage unit 53 outputs the previously received row address signal RADD0.

The address comparator 54 compares a current row address signal RADD(N) received from the address latch 52 with a previous row address signal RADD(N−1) received from the address storage unit 53, and outputs the comparison result. The address comparator 54 can be an exclusive OR gate. The exclusive OR gate 54 outputs a high-level logic signal when the current row address signal RADD(N) and the previous row address signal RADD(N−1) are different from each other.

The reset signal detector 55 outputs a reset detection signal RSTA in response to the chip select signal CSN, the latch clock signal ALCLK and the reset signal RST. Specifically, the reset signal detector 55 enables the reset detection signal RSTA when the reset signal detector 55 first receives the chip select signal CSN and the latch clock signal ALCLK after it receives the reset signal RST.

The frequency change control signal output unit 56 outputs the frequency change control signal WT in response to the output signal of the address comparator 54 and the reset detection signal RSTA. The frequency change control signal output unit 56 can be an OR gate. The OR gate 56 enables the frequency change control signal WT when one of the output signal of the address comparator 54 and the reset detection signal RSTA is at a high level.

Figure 6:
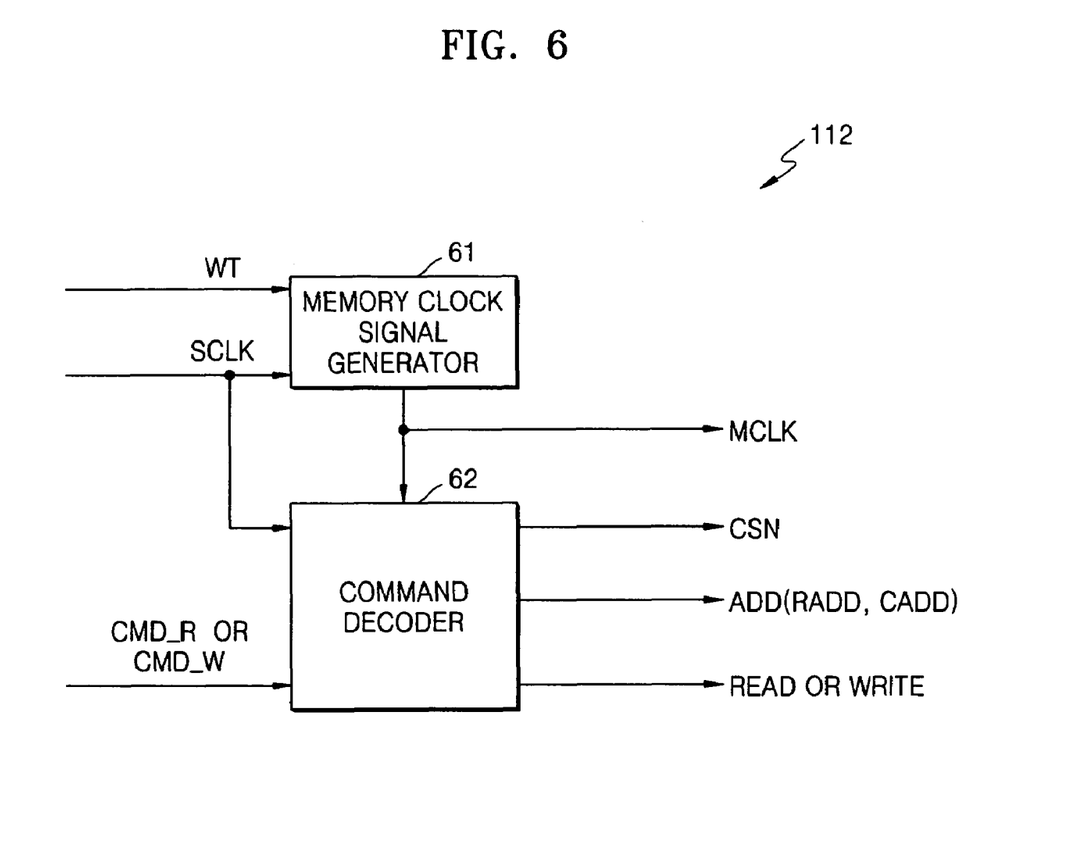
FIG. 6 is a block diagram of the memory interface shown in FIG. 4.

FIG. 6 is a block diagram of the memory interface 112 shown in FIG. 4. Referring to FIG. 6, the memory interface 112 includes a memory clock signal generator 61 and a command decoder 62. The memory clock signal generator 61 generates the memory clock signal MCLK with a predetermined frequency in response to the frequency change control signal WT and the system clock signal SCLK. Specifically, the memory clock signal generator 61 divides the system clock signal SCLK to generate the memory clock signal MCLK with a first frequency when the frequency change control signal WT is enabled. In addition, the memory clock signal generator 61 generates the memory clock signal MCLK with a second frequency when the frequency change control signal WT is disabled. Here, the second frequency is higher than the first frequency.

The command decoder 62 receives the system clock signal SCLK, the memory clock signal MCLK and the read command signal CMD_R or the write command signal CMD_W sent from the CPU 111. The command decoder 62 outputs the chip select signal CSN, an address signal ADD, and the data read control signal READ or the data write control signal WRITE in response to the read command signal CMD_R. The address signal ADD includes the row address signal RADD and column address signal CADD. The command decoder 62 outputs the chip select signal CSN, the address signal ADD and the data read control signal READ or the data write control signal WRITE in synchronization with the memory clock signal MCLK.

Next, a process of controlling the read operation of the memory 120, which is carried out by the memory controller 110, according to an exemplary embodiment of the present invention will now be explained with reference to FIGS. 4 to 9.

Figure 7:
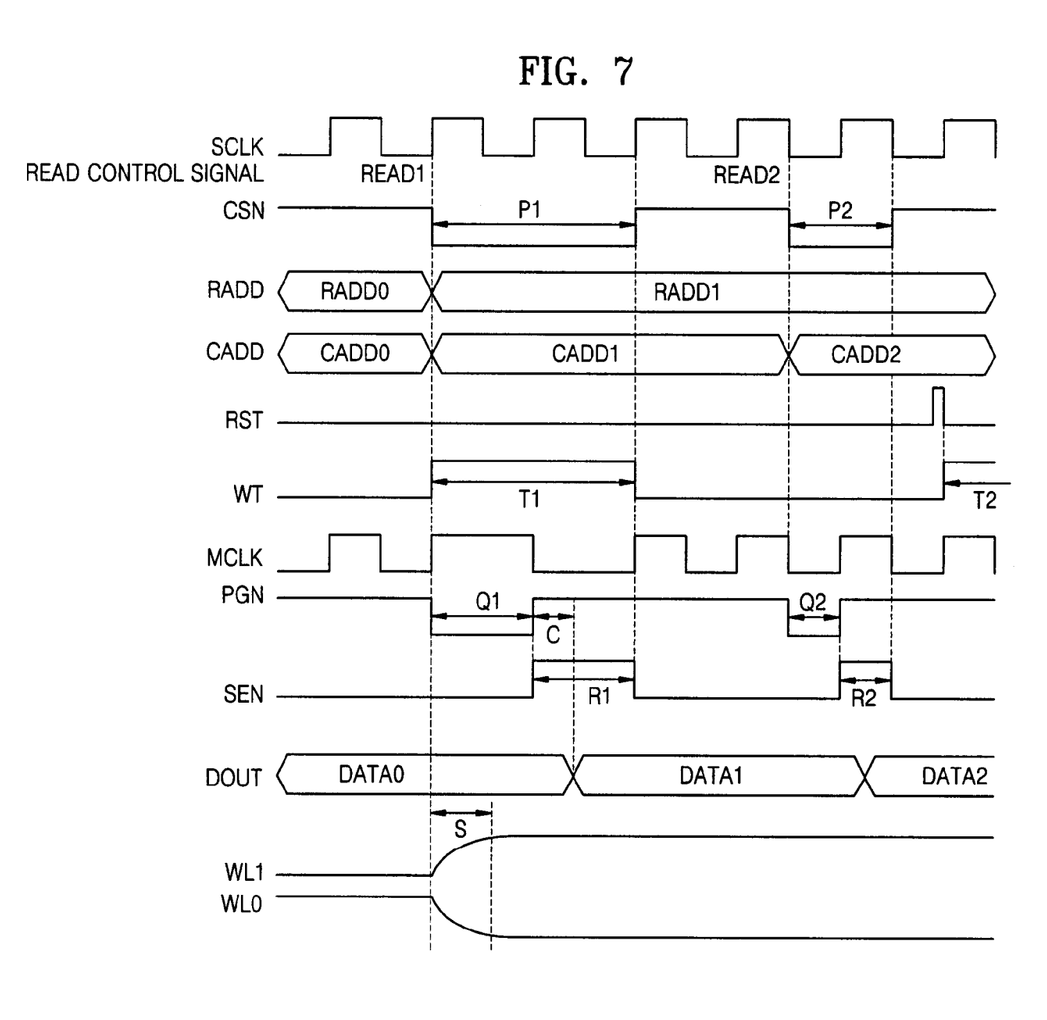
FIG. 7 is a timing diagram of signals related to a read operation of a memory, which is executed by the memory controller shown in FIG. 4.
Figure 8:
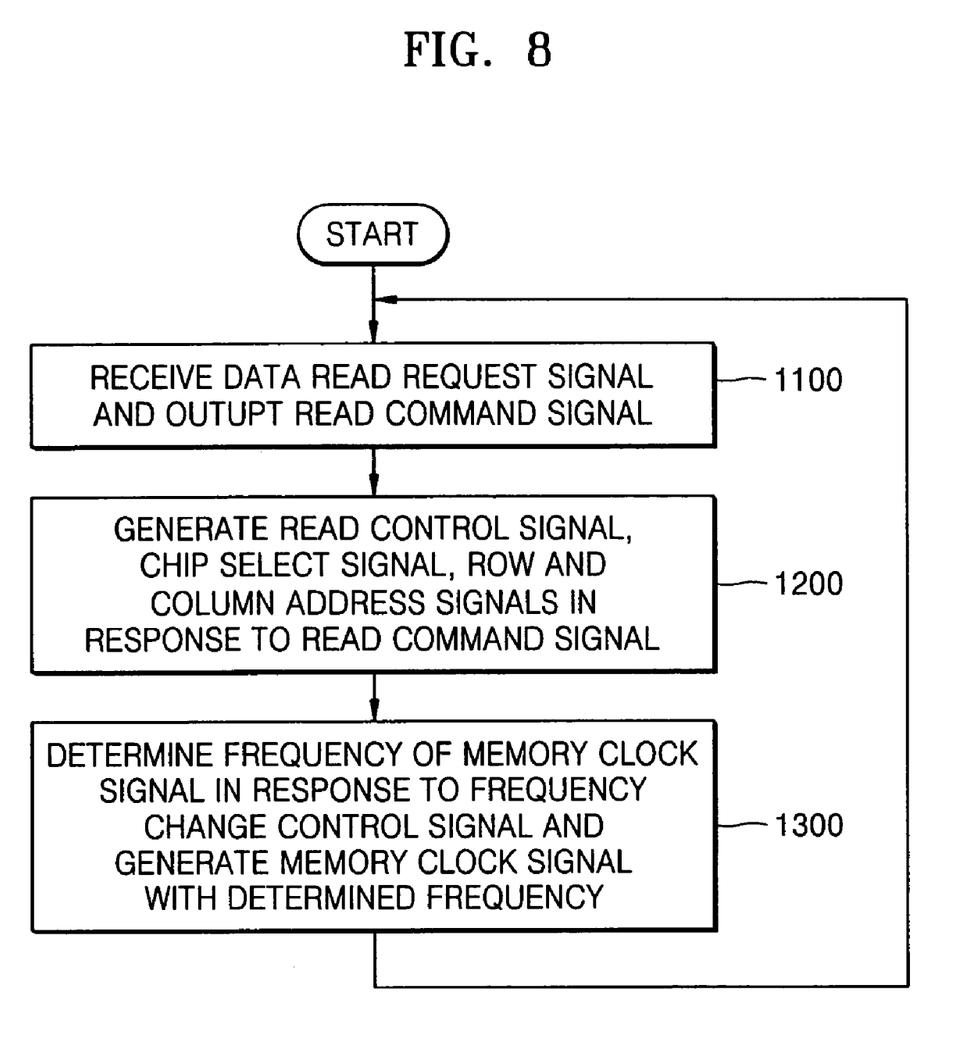
FIG. 8 is a flowchart illustrating a process of controlling a read operation of a memory, which is executed by the memory controller shown in FIG. 4, according to an exemplary embodiment of the present invention.

FIG. 7 is a timing diagram of signals used in the read operation of the memory 120 according to an exemplary embodiment of the present invention, and FIG. 8 is a flowchart illustrating the process of controlling the read operation of the memory 120, which is executed by the memory controller 110, according to an exemplary embodiment of the present invention.

Referring to FIGS. 4 to 8, the CPU 111 of the memory controller 110 outputs the read command signal CMD_R to the memory interface 112 in response to the data read request signal DRQ received from an external device in operation 1100. FIG. 7 illustrates a case where the memory interface 112 outputs a first read control signal READ1 and then outputs a second read control signal READ2 in response to the read command signal CMD_R.

The memory interface 112 receives the system clock signal SCLK, the frequency change control signal WT, and the read command signal CMD_R or the write command signal CMD_W. The command decoder 62 of the memory interface 112 outputs the first read control signal READ1, the chip select signal CSN, the row address signal RADD1 and the column address signal CADD1 to the memory 120 and the frequency change controller 113 in response to the read command CMD_R in operation 1200.

The memory clock signal generator 61 of the memory interface 112 determines a frequency of the memory clock signal MCLK in response to the frequency change control signal WT. In addition, the memory clock signal generator 61 divides the system clock signal SCLK to generate the memory clock signal MCLK with the determined frequency in operation 1300. Here, the command decoder 62 enables the chip select signal CSN for a time interval "P1" and then disables the chip select signal CSN in synchronization with the memory clock signal MCLK. Furthermore, the command decoder 62 outputs the first read control signal READ1, the row address signal RADD1 and the column address signal CADD1 in synchronization with the memory clock signal MCLK.

Figure 9:
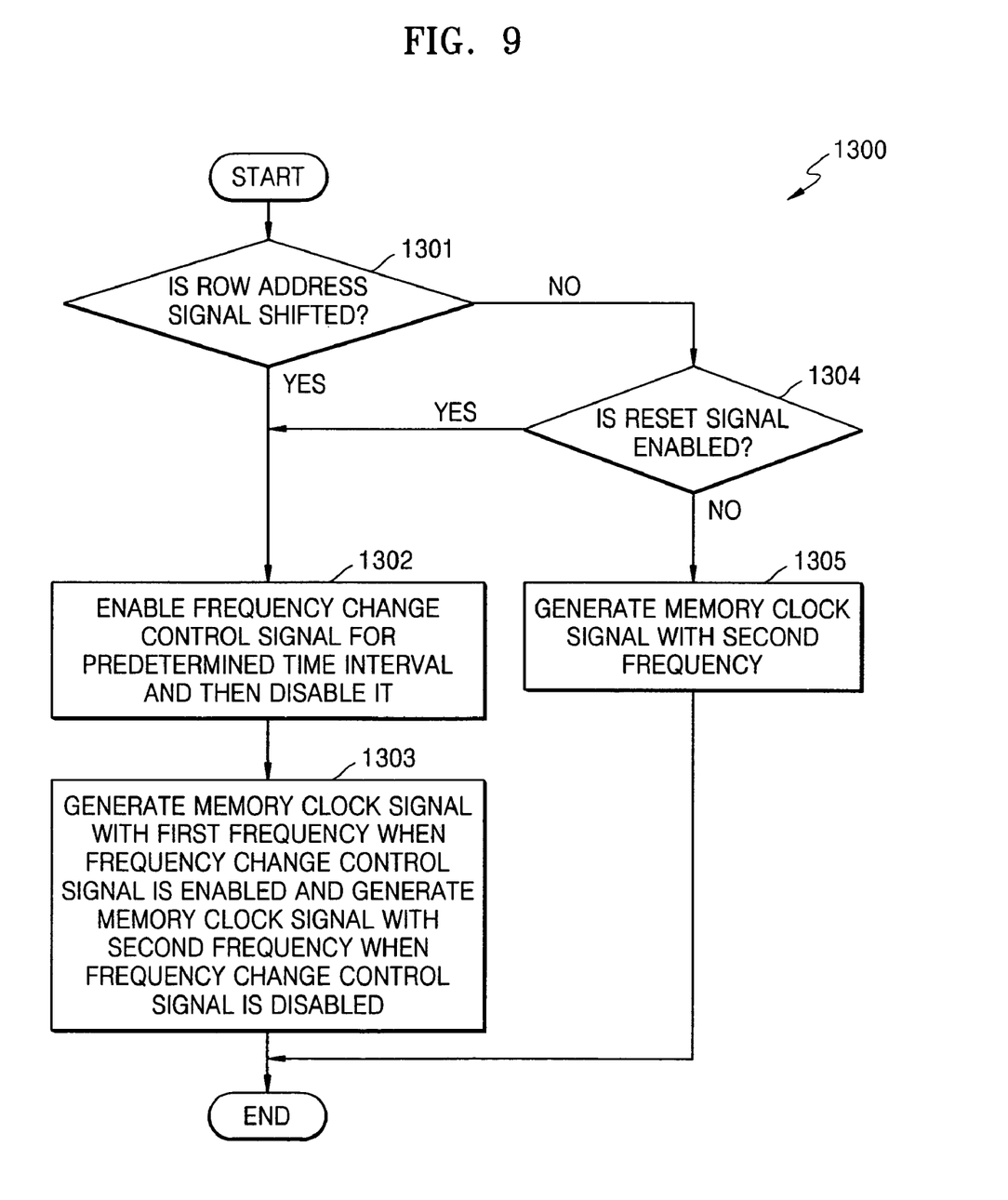
FIG. 9 is a flowchart illustrating a process of determining a frequency of the memory clock signal and generating the memory clock signal according to an exemplary embodiment of the present invention.

Operation 1300 will be explained in more detail with reference to FIG. 9. FIG. 9 is a flowchart illustrating the operation 1300 of determining the frequency of the memory clock signal MCLK and generating the memory clock signal MCLK.

In operation 1301, the frequency change controller 113 determines whether the row address signal RADD1 has changed when it receives the first read control signal READ1 from the memory interface 112. This operation will be described in more detail with reference to FIG. 5.

The latch clock signal generator 51 generates the latch clock signal ALCLK in response to the memory clock signal MCLK. When the latch clock signal ALCLK is at a high level, the address latch 52 latches the consecutively received row address signals RADD0 and RADD1 and outputs them. Here, the address storage unit 53 receives and stores only the row address signal RADD0 in synchronization with a rising edge of the latch clock signal ALCLK. Subsequently, the address latch 52 outputs the row address signal RADD1 and the address storage unit 53 outputs the previously received row address signal RADD0. The address comparator 54 outputs a high-level logic signal because the row address signal RADD1 received from the address latch 52 and the row address signal RADD0 received from the address storage unit 53 are different from each other.

In operation 1302, the frequency change control signal output unit 56 enables the frequency change control signal WT for a predetermined period of time "T1" in response to the output signal of the address comparator 54, and then disables the frequency change control signal WT. Here, the predetermined period of time "T1" is required for the address latch 52 and address storage unit 53 to respectively output the different row address signals.

In operation 1303, the memory clock signal generator 61 generates the memory clock signal MCLK with the first frequency during the enable interval "T1" of the frequency change control signal WT. Then, the memory clock signal generator 61 generates the memory clock signal MCLK with the second frequency when the frequency change control signal WT is disabled.

While FIG. 7 illustrates one cycle of the memory clock signal MCLK with the first frequency corresponding to two cycles of the system clock signal SCLK, the signals can have a different relationship if required. Furthermore, while FIG. 7 illustrates one cycle of the memory clock signal MCLK with the second frequency being identical to one cycle of the system clock signal SCLK, the signals can have a different relationship if required.

The memory 120 enables a pre-charge control signal PGN for an interval "Q1", as shown in FIG. 7, and then disables the pre-charge control signal PGN in response to the chip select signal CSN and the memory clock signal MCLK with the first frequency. When the pre-charge control signal PGN is enabled, a bit line (not shown) of the memory 120 is pre-charged to a predetermined voltage level. Furthermore, a corresponding wordline WL1 of the memory 120 is activated in response to the row address signal RADD1, and a voltage level of the wordline WL1 is increased. Consequently, a cell transistor (not shown) of the memory 120, connected to the wordline WL1, is turned on, and a data signal of a corresponding memory cell is applied to the bit line.

Then, the memory 120 enables the sense amplifier control signal SEN for a time interval "R1" in response to the chip select signal CSN and the memory clock signal MCLK with the first frequency, and then disables the sense amplifier control signal SEN. Here, the time interval "R1", during which the sense amplifier control signal SEN is enabled, is longer than the time interval "C" required for an effective data signal to be output from the memory cell.

When the sense amplifier control signal SEN is enabled, a bit line sense amplifier (not shown) of the memory 120 is activated to amplify the data signal applied to the bit line. Accordingly, a value of data stored in the corresponding memory cell is evaluated. Then, the memory 120 outputs the data signal amplified by the bit line sense amplifier as an output data signal DATA1 through a data output circuit (not shown).

A case where the command decoder 62 outputs the second read control signal READ2 in response to the read command signal CMD_R will now be explained.

The command decoder 62 outputs the second read control signal READ2, the row address signal RADD1 and the column address signal CADD2, as shown in FIG. 7.

In operation 1301, the frequency change controller 113 determines whether the row address signal RADD1 is shifted when the frequency change converter 113 receives the second read control signal READ2. This is explained in more detail with reference to FIG. 5.

The address latch 52 latches the row address signal RADD1 when the latch clock signal ALCLK is at a high level, and outputs the row address signal RADD1. Here, the address storage unit 53 receives and stores the row address signal RADD1 in synchronization with a rising edge of the latch clock signal ALCLK. Accordingly, both of the address latch 52 and the address storage unit 53 output the row address signal RADD1.

The address comparator 54 outputs a low-level logic signal because the row address signal RADD1 received from the address latch 52 and the row address signal RADD1 received from the address storage unit 53 are identical to each other. The frequency change control signal output unit 56 maintains the frequency change control signal WT in a disabled state in response to the output signal of the address comparator 54.

When the row address signal RADD1 is not shifted, the frequency change controller 113 determines whether the external reset signal RST is enabled in operation 1304. This operation will be explained in mode detail with reference to FIG. 5.

The reset signal detector 55 enables the reset detection signal RSTA when the reset signal detector 55 first receives the chip select signal CSN and the latch clock signal ALCLK after it receives the reset signal RST. Then, the process proceeds to operation 1302 to repeat operations 1302 and 1303, as shown in FIG. 9. Here, the memory clock signal MCLK with the first frequency, which is lower than the frequency of the system clock signal SCLK, is generated when the read operation of the memory 120 is first carried out after the reset signal RST is enabled in order to secure a stable read operation of the memory 120.

When the reset signal RST is not enabled in operation 1304, that is, when the reset detection signal RSTA is disabled, the frequency change control signal output unit 56 does not enable the frequency change control signal WT. Consequently, the memory clock signal generator 61 continuously generates the memory clock signal MCLK with the second frequency in operation 1305.

As described above, the memory controller 110 according to an exemplary embodiment of the present invention generates the memory clock signal MCLK with a frequency that is lower during the interval "P1" when the row address signal is shifted than during the interval "P2" when the row address signal is not shifted. Accordingly, the time interval "S" required for the wordline WL1 to be sufficiently activated and the time interval "C" required for an effective data signal to be output from the memory cell can be secured. Consequently, the memory 120 can output effective data when it is operated at a high frequency.

Furthermore, the memory controller 110 according to an exemplary embodiment of the present invention temporarily changes the frequency of the memory clock signal MCLK only when the row address signal is shifted (during the interval "P1") or when the reset signal RST is enabled. Accordingly, in the case of a system in which the read operation of the memory 120 is frequently executed, the operation performance of the system can be prevented from being deteriorated due to a read operation speed of the memory 120.

A smart card including a memory controller according to an exemplary embodiment of the present invention will now be explained.

Figure 10:
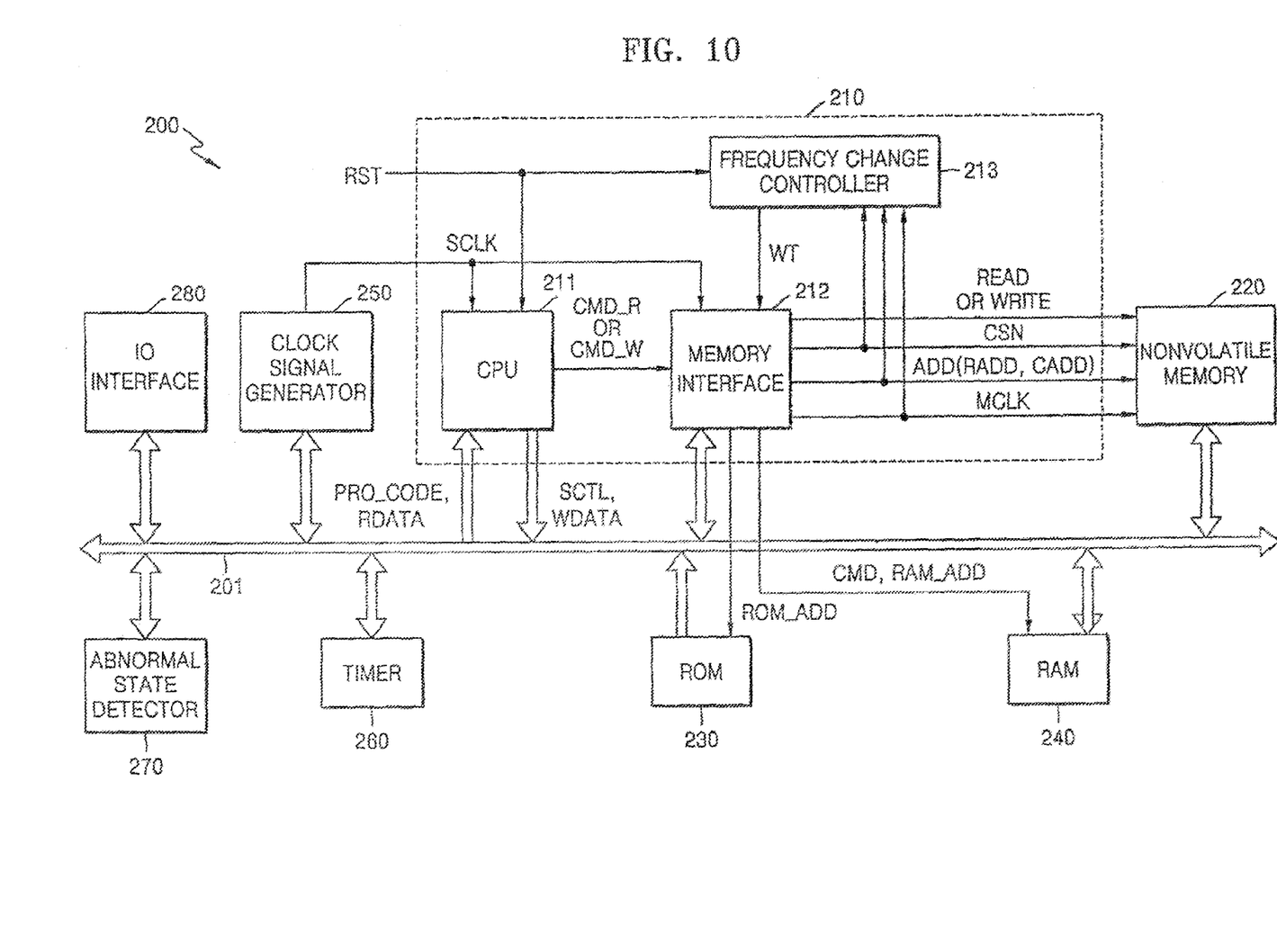
FIG. 10 is a block diagram of a smart card including the memory controller of FIG. 4 according to an exemplary embodiment of the present invention.

FIG. 10 is a block diagram of a smart card 200 including a memory controller 210 according to the present invention. Referring to FIG. 10, the smart card 200 includes the memory controller 210, a nonvolatile memory 220, a read only memory (ROM) 230, a random access memory (RAM) 240, a clock signal generator 250, a timer 260, an abnormal state detector 270, and an input/output (IO) interface 280. The memory controller 210 includes a CPU 211, a memory interface 212, and a frequency change controller 213. All of the components of the smart card 200 are connected by a system bus 201.

The CPU 211 writes data WDATA to the nonvolatile memory 220 or reads data RDATA from the nonvolatile memory 220 via the memory interface 212. More specifically, to write the data WDATA to the nonvolatile memory 220, the CPU 211 outputs the data write command signal CMD_W to the memory interface 212 and outputs the data WDATA to the nonvolatile memory 220 via the system bus 201 in order to write the data WDATA to the nonvolatile memory 220. To read the data RDATA from the nonvolatile memory 220, the CPU 211 outputs the read command signal CMD_R to the memory interface 212, and then receives the data RDATA from the nonvolatile memory 220 via the system bus 201.

Furthermore, the CPU 211 receives a program code PRO_CODE from an external smart card host via the IO interface 280 and the system bus 201. The CPU 211 executes a command indicated by the program code PRO_CODE and outputs a control signal SCTL to the system bus 201 to control devices in the smart card 200. The CPU 211 executes an operating system (OS) program to store use information and carries out various coding operations.

The operation of the memory interface 212 is similar to the operation of the memory interface 112 shown in FIG. 4 except, for example, that the memory interface 212 outputs an address signal ROM_ADD to the ROM 230 or outputs a command signal CMD and an address signal RAM_ADD to the RAM 240 in response to a memory control signal (not shown) received from the CPU 211 and the memory interface 212 is connected to the system bus 201.

The nonvolatile memory 220 stores the data WDATA received via the system bus 201 and reads the data RDATA and outputs it through the system bus 201 under the control of the CPU 211 and memory interface 212.

The ROM 230 stores the OS program and the RAM 240 temporarily stores data generated when the CPU 211 executes the OS program. The clock signal generator 250 generates a system clock signal SCLK and outputs the system clock signal SCLK to all of the devices in the smart card 200. The timer 260 controls timing required for the CPU 211 to execute the OS program. The abnormal state detector 270 detects an abnormal state of the external environment, for example, abnormal voltages, frequencies, temperatures, light and so on, and generates a reset signal RST to reset all the devices in the smart card 200. When the smart card 200 is connected to the external smart card host, the IO interface 280 interfaces the CPU 211 to the external smart card host.

As described above, a memory controller, a smart card including the memory controller, and a method of controlling a read operation of a memory according to exemplary embodiments of the present invention can prevent the memory from outputting erroneous data when the memory is operated at a high frequency. Furthermore, exemplary embodiments of the present invention can prevent the performance of a system in which a read operation of the memory is frequently executed from being deteriorated due to a read operation speed of the memory.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A memory controller for controlling one of a read operation and a write operation of a memory, comprising:
   a central processing unit (CPU) for outputting a read command signal in response to a data read request signal and outputting a write command signal in response to a data write request signal;
   a memory interface for outputting a plurality of control signals in response to one of the read command signal and the write command signal, generating a memory clock signal having a variable frequency by dividing a system clock signal, and changing the frequency of the memory clock signal based on a frequency change control signal; and
   a frequency change controller for outputting the frequency change control signal in response to the plurality of control signals, the memory clock signal, and a reset signal, wherein the frequency change controller comprises
   an address comparator for comparing a current row address of the memory with an immediately preceding row address and producing a comparison signal that is a logic high level when the current row address is different than the immediately preceding row address, and
   a frequency change control signal output unit receiving the comparison signal and a reset detection signal produced when a read operation is requested after the reset signal is received, wherein the frequency change control signal is enabled when the comparison signal is a high level or the reset detection signal is a high level.

2. The memory controller of claim 1, wherein the plurality of control signals includes a row address signal, a column address signal, and a chip select signal.

3. The memory controller of claim 1, wherein during the read operation, the frequency of the memory clock signal is changed to a first frequency when the frequency change control signal is enabled when an address signal is changed or when the reset signal is enabled and then to a second frequency when the frequency change control signal is disabled when the address signal is changed or when the reset signal is disabled.

4. The memory controller of claim 2, wherein the frequency change controller further comprises:
   a latch clock signal generator for receiving the memory clock signal from the memory interface and generating a latch clock signal;
   a row address latch for latching the current row address signal in response to the latch clock signal; and an address storage unit for storing the immediately preceding row address signal received from the address latch in response to the latch clock signal.

5. The memory controller of claim 4, wherein the frequency change controller further comprises:
a reset signal detector for generating the reset detection signal in response to the chip select signal and the latch clock signal that are first received after the reset signal detector receives the reset signal.

6. The memory controller of claim 5, wherein the memory interface comprises:
a memory clock signal generator for receiving the system clock signal and generating the memory clock signal having a first frequency or a second frequency in response to the frequency change control signal; and
a command decoder for receiving the system clock signal, the memory clock signal and the read command signal or the write command signal and outputting the plurality of control signals.

7. The memory controller of claim 6, wherein the memory clock signal generator generates the memory clock signal with the first frequency when the frequency change control signal is enabled and generates the memory clock signal with the second frequency when the frequency change control signal is disabled.

8. The memory controller of claim 7, wherein the period of the memory clock signal with the first frequency is longer than the period of the memory clock signal with the second frequency.

9. A smart card, comprising:
a read only memory (ROM) for storing an operating system (OS) program;
a clock signal generator for generating a system clock signal;
an abnormal state detector for detecting an abnormal state caused by a variation in an external environment and generating a reset signal based on the detected result;
a nonvolatile memory for storing data; and
a memory controller for generating a memory clock signal having a variable frequency by dividing the system clock signal, controlling one of a read operation and a write operation of the nonvolatile memory while changing a frequency of the memory clock signal, and executing the OS program to store user information and including
a memory interface for outputting a plurality of control signals including a row address and a column address of the nonvolatile memory in response to one of a read command signal and a write command signal, receiving the system clock signal, generating the memory clock signal, and changing the frequency of the memory clock signal in response to a frequency change control signal; and
a frequency change controller for outputting the frequency change control signal in response to the plurality of control signals, the memory clock signal and a reset signal, with wherein the frequency controller comprises
an address comparator for comparing a current row address of the memory with an immediately preceding row address and producing a comparison signal that is a logic high level when the current row address is different than the immediately preceding row address, and
a frequency change control signal output unit receiving the comparison signal and a reset detection signal produced when a read operation is requested after the reset signal is received, wherein the frequency change control signal is enabled when the comparison signal is a high level or the reset detection signal is a high level.

10. The smart card of claim 9, wherein the memory controller further comprises:
a central processing unit (CPU) for generating one of the read command signal and the write command signal, outputting a write data signal to the nonvolatile memory via a system bus or receiving a read data signal from the nonvolatile memory via the system bus, executing the OS program, and communicating with a smart card host.

11. The smart card of claim 10, further comprising:
an input/output interface for interfacing the CPU to the smart card host; and
a random access memory (RAM) for storing data generated when the CPU executes the OS program.

12. The smart card of claim 10, wherein the plurality of control signals include one of a read control signal, a write control signal, the row address, the column address, and a chip select signal.

13. A method of controlling a read operation of a memory, comprising:
receiving a data read request signal and outputting a read command signal;
outputting control signals in response to the read command signal and a system clock signal;
generating a frequency change control signal in response to a reset signal and the control signals, when a read operation of the memory is first carried out after the reset signal is received; and
determining a frequency of a memory clock signal based on the system clock signal in response to the frequency change control signal and generating the memory clock signal having the determined frequency that is varied by dividing the system clock signal,
wherein the step of determining the frequency of the memory clock signal and the step of generating the memory clock signal comprise:
receiving the control signals and determining whether a current row address signal has shifted from a previous row address signal;
enabling the frequency change control signal for a predetermined period of time and disabling the frequency change control signal when it is determined that the row address signal has shifted;
maintaining the frequency change control signal in the disabled state when the row address signal has not shifted; and
generating the memory clock signal with a first frequency when the frequency change control signal is enabled and generating the memory clock signal with a second frequency when the frequency change control signal is disabled,
wherein the step of determining the frequency of the memory clock signal and the step of generating the memory clock signal comprise:
generating a reset detection signal by detecting that a chip select signal and a latch clock signal are received after the reset signal is received;
enabling the frequency change control signal for a predetermined period of time and disabling the frequency change control signal when the reset detection signal is enabled;
maintaining the frequency change control signal in the disabled state when the reset detection signal is disabled; and
generating the memory clock signal with a first frequency when the frequency change control signal is enabled and generating the memory clock signal with a second frequency when the frequency change control signal is disabled.

14. The method of claim 13, wherein the period of the memory clock signal with the first frequency is longer than the period of the memory clock signal with the second frequency.

15. The method of claim 13, wherein, the step of enabling the frequency change control signal and disabling the frequency change control signal comprises:

enabling the frequency change control signal for a predetermined period of time and disabling the frequency change control signal when the read operation of the memory is first carried out after the reset signal is enabled.

16. The method of claim 13, wherein the period of the memory clock signal with the first frequency is longer than the period of the memory clock signal with the second frequency.

* * * * *